(12) United States Patent
Guerry et al.

(10) Patent No.: US 12,091,160 B2
(45) Date of Patent: *Sep. 17, 2024

(54) ACTIVELY CONTROLLED SURFACES

(71) Applicant: The Boeing Company, Chicago, IL (US)

(72) Inventors: Joshua Benjamin Guerry, Daniel Island, SC (US); Peter Aaron Koch, Kent, WA (US); Li Chun Chang, Mt. Pleasant, SC (US); Robert Hans Thim, Woodinville, WA (US)

(73) Assignee: THE BOEING COMPANY, Arlington, VA (US)

( * ) Notice: Subject to any disclaimer, the term of this patent is extended or adjusted under 35 U.S.C. 154(b) by 85 days.

This patent is subject to a terminal disclaimer.

(21) Appl. No.: 17/885,082

(22) Filed: Aug. 10, 2022

(65) Prior Publication Data

US 2022/0388632 A1 Dec. 8, 2022

Related U.S. Application Data

(63) Continuation-in-part of application No. 16/508,082, filed on Jul. 10, 2019, now Pat. No. 11,447,237,
(Continued)

(51) Int. Cl.
| | |
|---|---|
| *B64C 21/10* | (2006.01) |
| *B08B 17/06* | (2006.01) |
| *B64D 15/00* | (2006.01) |
| *B64D 15/12* | (2006.01) |
| *B64D 15/16* | (2006.01) |

(Continued)

(52) U.S. Cl.
CPC ............ *B64C 21/10* (2013.01); *B08B 17/065* (2013.01); *B64D 15/00* (2013.01); *B64D 15/12* (2013.01); *B64D 15/163* (2013.01); *B81B 3/0094* (2013.01); *B81B 7/0029* (2013.01);
(Continued)

(58) Field of Classification Search
CPC ......... B64C 21/10; B81B 3/0094; B81B 7/02; B81B 7/04; B64D 15/00; B64D 15/16
See application file for complete search history.

(56) References Cited

U.S. PATENT DOCUMENTS

| | | |
|---|---|---|
| 4,732,351 A | 3/1988 | Bird |
| 6,194,685 B1 | 2/2001 | Rutherford |

(Continued)

FOREIGN PATENT DOCUMENTS

| | | |
|---|---|---|
| CN | 101704410 | 5/2010 |

OTHER PUBLICATIONS

Machine generated English language translation of abstract for CN 101704410 published on May 12, 2010.
(Continued)

*Primary Examiner* — Michael H Wang
(74) *Attorney, Agent, or Firm* — Kolitch Romano Dascenzo Gates LLC

(57) ABSTRACT

Active surface structures comprise an exposed surface, a controlled group of MEMS (micro-electro-mechanical system) actuators, and a controlled region of the exposed surface corresponding to the controlled group. The controlled region has a first state, and a second state that is less textured than the first state. Active surface structures may be part of an apparatus that includes a controller and/or one or more sensors. The controller, sensors, and the controlled region may form a feedback loop in which the active surface structure is actively controlled.

24 Claims, 4 Drawing Sheets

Related U.S. Application Data which is a continuation of application No. 14/522,255, filed on Oct. 23, 2014, now abandoned.

(51) Int. Cl.
  B81B 3/00 (2006.01)
  B81B 7/00 (2006.01)
  B81B 7/02 (2006.01)
  B81B 7/04 (2006.01)
  B81C 1/00 (2006.01)

(52) U.S. Cl.
  CPC ............... B81B 7/02 (2013.01); B81B 7/04 (2013.01); B81C 1/00206 (2013.01); Y02T 50/10 (2013.01)

(56) References Cited

U.S. PATENT DOCUMENTS

| | | |
|---|---|---|
| 6,890,152 B1 | 5/2005 | Thisted |
| 6,994,045 B2 | 2/2006 | Paszkowski |
| 7,678,997 B2 | 3/2010 | Rawlings |
| 7,770,453 B2 | 8/2010 | Ludwiczak |
| 8,217,554 B2 | 7/2012 | Royer, Jr. et al. |
| 2006/0115623 A1 | 6/2006 | Aizenberg et al. |
| 2009/0001222 A1 | 1/2009 | McKeon |
| 2009/0011222 A1 | 1/2009 | Xiu et al. |
| 2011/0280723 A1 | 11/2011 | Libergren |
| 2011/0287223 A1 | 11/2011 | Victor et al. |
| 2012/0181346 A1 | 7/2012 | Greer et al. |
| 2012/0258283 A1 | 10/2012 | Sohn et al. |
| 2012/0269645 A1 | 10/2012 | Narasimalu et al. |
| 2012/0276334 A1 | 11/2012 | Fedynyshyn et al. |
| 2014/0017454 A1 | 1/2014 | Boyce et al. |
| 2014/0113144 A1 | 4/2014 | Loth et al. |
| 2014/0150814 A1 | 6/2014 | Peltz |
| 2015/0044420 A1 | 2/2015 | Nowak et al. |
| 2015/0378434 A1 | 12/2015 | Baskaran |

OTHER PUBLICATIONS

European Patent Office, Extended European Search Report for related European patent application EP 15 19 0974, Mar. 11, 2016.
European Patent Office, Examination Report for related European Patent Application No. 15 190 974.4, dated Feb. 16, 2017.

ACTIVELY CONTROLLED SURFACES

RELATED APPLICATIONS

This application is a continuation-in-part of and claims priority to U.S. patent application Ser. No. 16/508,082, filed Jul. 10, 2019, and issued Sep. 20, 2022 as U.S. Pat. No. 11,447,237, which claims priority to U.S. patent application Ser. No. 14/522,255, filed on Oct. 23, 2014, the disclosures of which are incorporated herein by reference.

FIELD

The present disclosure relates to actively controlled surfaces.

BACKGROUND

Hydrophobicity is a physical property of a surface on which wetting is relatively difficult. Water drops on a hydrophobic surface tend to bead and roll off the surface rather than stick to the surface.

Water, ice, and surface contamination are significant problems in various industries including transportation, power, buildings, and consumer products. For example, ice accumulation can reduce the performance of aircraft, watercraft, and wind turbines. As another example, solar panels and electronic displays are subject to surface contamination that reduces performance and/or usability.

Though hydrophobic, including superhydrophobic, surfaces may be beneficial in some situations (such as during use, cleaning, wet conditions, condensing conditions, and/or icing conditions), in other situations a hydrophobic surface may reduce performance and/or utility of an apparatus.

Conventional hydrophobic surfaces are passive structures and may wear with use and/or may be damaged by use. In particular, many industrial and consumer uses subject devices to harsh conditions (e.g., thermal, abrasive, and/or chemical conditions such as may be experienced during environmental exposure, repeated handling, icing conditions, and/or high speed flight). Once sufficiently worn or damaged, a hydrophobic surface may lose its hydrophobicity and therefore its effectiveness.

SUMMARY

Active surface structures comprise an exposed surface, a controlled group of one or more MEMS (micro-electro-mechanical system) actuators, and a controlled region of the exposed surface corresponding to the controlled group. The controlled region is configured to be actively changed between a first state and a second state that is less textured than the first state as a result of the one or more MEMS actuators being activated or deactivated.

Active surface structures may be a component of an apparatus such as a vehicle (e.g., an aircraft). The apparatus may include a controller and/or one or more sensors. The controller may be configured to control the controlled region of the active surface structures based on information from the sensors. Further, the controller, sensors, and the controlled region may form a feedback loop in which the active surface structures are actively controlled.

DESCRIPTION

Figure 1:
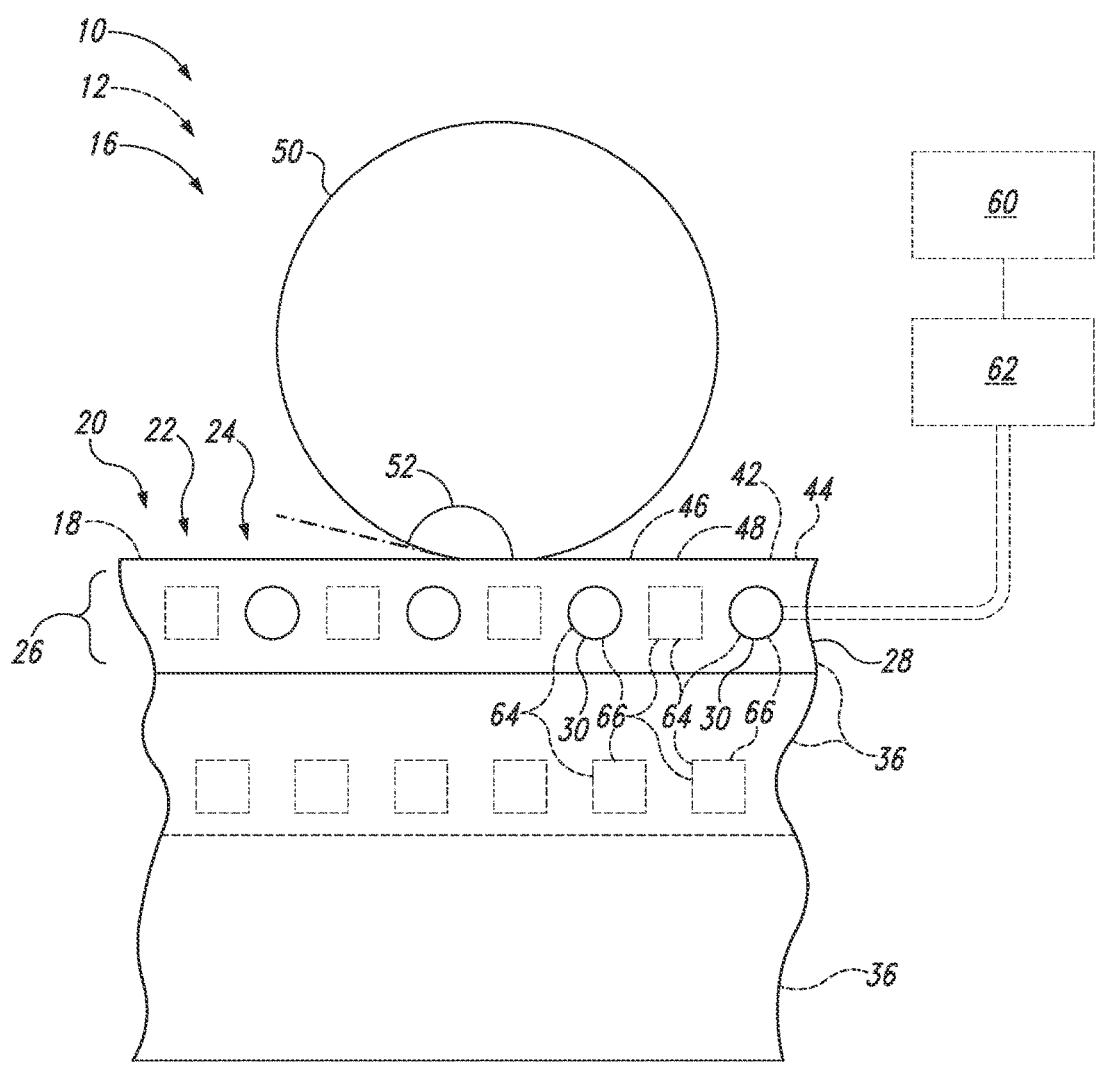
FIG. 1 is a schematic representation of apparatuses with active surface structures.

Actively controlled surfaces, apparatuses including the same, and methods of use are disclosed herein. In general, in the drawings, elements that are likely to be included in a given embodiment are illustrated in solid lines, while elements that are optional or alternatives are illustrated in dashed lines. However, elements that are illustrated in solid lines are not essential to all embodiments of the present disclosure, and an element shown in solid lines may be omitted from a particular embodiment without departing from the scope of the present disclosure. Elements that serve a similar, or at least substantially similar, purpose are labeled with numbers consistent among the figures. Like numbers in each of the figures, and the corresponding elements, may not be discussed in detail herein with reference to each of the figures. Similarly, all elements may not be labeled in each of the figures, but reference numerals associated therewith may be used for consistency. Elements, components, and/or features that are discussed with reference to one or more of the figures may be included in and/or used with any of the figures without departing from the scope of the present disclosure.

FIG. 1 is a schematic representation of an apparatus 10 comprising a body 16 with an exposed surface 20. The body 16 includes at least one active surface structure 22 (an actively controlled surface structure). Active surface structures 22 include a controlled group 26 of one or more MEMS (micro-electro-mechanical system) actuators 30 and a controlled region 24 of the exposed surface 20 corresponding to the controlled group 26. In some examples, the body 16 also includes an outer elastomeric covering 28 that defines the exposed surface 20.

The controlled region 24 may be in a first state 42, where the controlled region 24 is textured, or in a second state 44, where the controlled region 24 is not textured, less textured, and/or smooth. As used herein, where the controlled region 24 in the second state 44 is described as "smooth," the controlled region 24 is smoother (i.e., less textured) than when in the first state 42. As used herein, where the controlled region 24 in the first state 42 is described as "textured," the controlled region 24 includes at least one more protruding feature than when in the second state 44. The controlled region 24 may have additional states and/or may be in an admixture of the first state 42 and the second state 44. Additionally, the controlled region 24 may have a third state with a texture that differs from the first state 42 and the second state 44. Also, more than three states may be incorporated into the controlled region 24.

Spatially relative terms, e.g., "below," "bottom," "inner," "above," "top," "outer," and the like, used with respect to the apparatus 10 and components of the apparatus 10 refer to positions relative to the exposed surface 20. As used herein, components within the active surface structure 22 that are closer to the exposed surface 20 are above components that are further away from the exposed surface 20. As also used herein, the exposed surface 20 is the topmost surface, and the outer surface, of the active surface structure 22.

Active surface structures 22 are configured to selectively transition the controlled region 24 between at least the first state 42 and the second state 44 by actuating or deactuating the MEMS actuator(s) 30 of the controlled group 26. Active surface structures 22 may include a plurality of controlled groups 26 and a corresponding plurality of controlled regions 24. Thus, active surface structures 22 may have a plurality of controlled regions 24 that may be independently transitioned between first states 42 and second states 44, and optionally one or more additional states.

Controlled regions 24 in the first state 42 may be one of superomniphobic, superhydrophobic, hydrophobic, hydrophilic, or superhydrophilic; and controlled regions 24 in the second state 44 also may be one of superhydrophobic, hydrophobic, hydrophilic, or superhydrophilic. Additionally, the first state 42 and/or the second state 44 may be icephobic and/or oleophobic, and may be configured for self-cleaning action and/or contamination resistance due to its hydrophobicity, its optional icephobicity, its optional oleophobicity, and/or the surface geometry of the controlled region 24. Specifically, in the first state 42 and/or the second state 44, the controlled region 24 may not adhere tightly to oil, dirt, and/or other contaminants that may accumulate on the controlled region 24.

In some examples, controlled regions 24 in the second state 44 are less hydrophobic than in the first state 42, however, the opposite also may true in other examples.

Hydrophobic surfaces typically are defined by a water contact angle 52 of greater than 90°. The water contact angle 52 is the angle inside a water drop 50 measured between the surface and the tangent of the water drop 50 at the contact point. Hydrophobic surfaces may have non-polar and/or hydrophobic surface chemistries, and/or may have a low surface energy for water contact. Hydrophobic surfaces generally are not highly wettable and may include macroscopic and/or microscopic surface structures to deter wetting (e.g., non-polar regions, microstructures, and/or nanostructures).

Superhydrophobic surfaces, which also may be referred to as ultrahydrophobic, are highly hydrophobic surfaces, typically defined by a water contact angle 52 of greater than 150°. The contact angle 52 of water with the controlled region 24 in a superhydrophobic state may be greater than 150°, greater than 160°, and/or greater 170°. The contact angle 52 of water with the controlled region 24 in a superhydrophobic state is greater than the contact angle 52 of water with the controlled region 24 in a less hydrophobic state. For example, the contact angle 52 of water with the controlled region 24 in a less hydrophobic state may be less than 160°, less than 150°, less than 120°, less than 100°, less than 90°, less than 80°, less than 70°, less than 60°, less than 50°, less than 40°, less than 30°, less than 20°, less than 10°, greater than 70°, greater than 80°, greater than 90°, greater than 100°, greater than 120°, and/or greater than 150°.

Hydrophilic surfaces typically are defined by a water contact angle 52 of less than 90°, and superhydrophilic surfaces typically are defined by a water contact angle 52 of less than 10°.

The hydrophobicity of a surface may also be controlled, or defined by surface structures. The first state 42 of the controlled region 24 is a textured state where the exposed surface 20 has a surface structure that may establish and/or enhance hydrophobicity. The second state 44 of the controlled region 24 is a less textured state that has less texture than the first state 42. For example, an average surface roughness of the controlled region 24 in the first state 42 may be greater than an average surface roughness of the controlled region 24 in the second state 44. The controlled region 24 in the first state 42 may have an average surface roughness of less than 100,000 nm (nanometers), less than 10,000 nm, less than 3,000 nm, less than 1,000 nm, less than 300 nm, less than 100 nm, greater than 10 nm, greater than 30 nm, greater than 100 nm, greater than 300 nm, and/or greater than 1,000 nm. The controlled region 24 in the second state 44 may have an average surface roughness of less than 3,000 nm, less than 1,000 nm, less than 300 nm, less than 100 nm, less than 30 nm, less than 10 nm, greater than 1 nm, greater than 10 nm, greater than 30 nm, greater than 100 nm, and/or greater than 300 nm.

Active surface structures 22 may be useful where water repelling, lack of wetting, low hydrodynamic drag, ice repelling, de-icing, easy cleaning, and/or self-cleaning are desirable. Apparatus 10 may be, but is not required to be, an exterior structure with the exposed surface 20 exposed to the atmosphere and/or the local environment. For example, apparatus 10 may be, and/or may include, a vehicle (such as an aircraft, an unmanned aerial vehicle, a rotorcraft, a land vehicle, a watercraft, and/or a spacecraft), a wind turbine, a tower, an electronic component (such as an amplifier, a networking appliance, and/or an antenna), a consumer electronic product (such as a cell phone, a camera, and/or a computer), a medical device, a hydraulic component, a pump, a mirror, a window, a solar panel, an electronic display, a touchscreen display, an optic, glasses, goggles, a building material (such as siding and/or wall panels), a building exterior, a textile (such as clothing, bags, and/or luggage), a packaging container, and/or an envelope. More particularly, e.g., where the apparatus 10 is a fixed or mobile structure (such as a wind turbine or a vehicle 12), the body 16 may include, and/or may be, an airfoil, an aerodynamic component, a hull, a hydrodynamic component, a casing, a windshield, a nose cone, a radome, a superstructure, a wing, a tailplane, a horizontal stabilizer, a vertical stabilizer, an empennage, a fuselage, a skin, a propeller blade, a rotor blade, a turbine blade, a nacelle, and/or an engine cowling.

Figure 2:
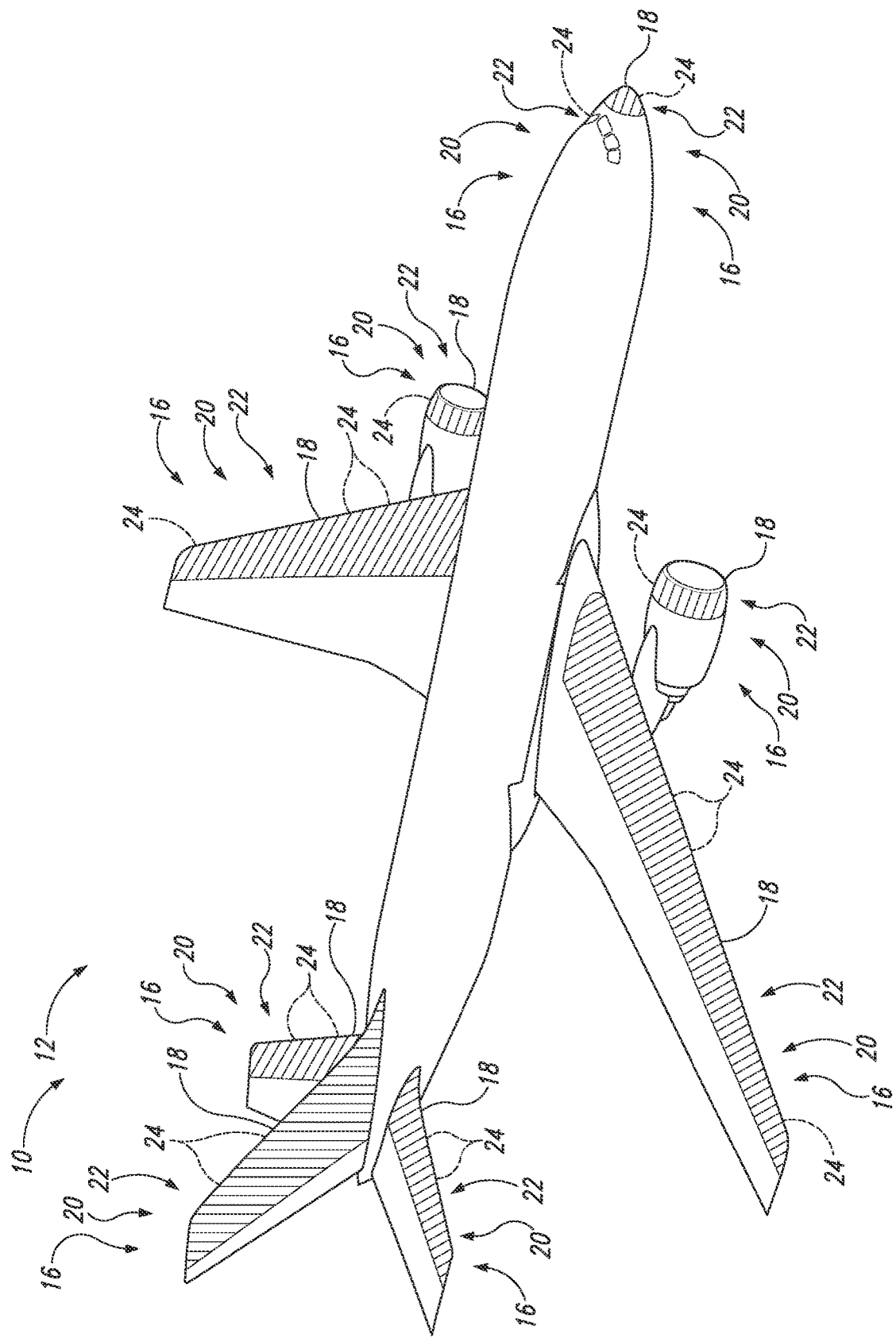
FIG. 2 is a perspective drawing of an example vehicle (an aircraft) illustrating several possible locations for active surface structures.

FIG. 2 illustrates several possible locations for active surface structures 22 on a particular type of vehicle 12, e.g., an aircraft. As also illustrated in FIG. 2, the body 16 may include, and/or may be, an aerodynamic component and/or an airfoil that has a leading edge 18 (e.g., the front of the wings, etc.). The active surface structure 22 may be proximate to, and/or include, the leading edge 18 of the airfoil and/or the aerodynamic component (e.g., the controlled region 24 may or may not include the leading edge 18, and the controlled region 24 may be proximate to the leading edge 18). Additionally or alternatively, the active surface structure 22 may be oriented relative to the leading edge 18. For example, the active surface structure 22 may be elongated with an elongated direction oriented parallel, substantially parallel, oblique, perpendicular, and/or substantially perpendicular to the leading edge. On certain airfoils and/or aerodynamic surfaces without a deicing mechanism, ice tends to form near the leading edge. Hence, incorporating active surface structures 22 including, abutting, and/or proximate to the leading edge 18 may prevent ice accumulation and/or assist ice removal.

Returning to FIG. 1, the outermost (or topmost) component of the active surface structure 22 may be an elastomeric covering 28, i.e., the elastomeric covering 28 may define at least a portion of the exposed surface 20. The elastomeric covering 28, when present, is configured to distort under the influence of the MEMS actuator(s) 30 of the controlled group 26. Thus, motion of the MEMS actuator(s) 30 of the controlled group 26 affects the surface shape (i.e., the texture) of the controlled region 24 of the exposed surface 20. The elastomeric covering 28, without any distortions induced by the MEMS actuator(s) 30, may be superhydrophobic, hydrophobic, hydrophilic, superhydrophilic, oleophobic, oleophilic, and/or not superhydrophobic. Generally, the undistorted exposed surface 20 of the elastomeric covering 28 is the second state 44 of the controlled region 24 of the exposed surface 20, and the distorted exposed surface 20 of the elastomeric covering 28 is the first state 42 of the controlled region 24 of the exposed surface 20. However, the elastomeric covering 28 may be configured such that the undistorted exposed surface 20 of the elastomeric covering 28 is the first state 42 and the distorted exposed surface 20 of the elastomeric covering 28 is the second state 44.

The elastomeric covering 28, when present, covers the controlled group 26, directly or indirectly contacting at least a portion of each of the MEMS actuators 30 of the controlled group 26. The elastomeric covering 28 may encase one or more (e.g., all) of the MEMS actuators 30 of the controlled group 26. The elastomeric covering 28 may include, and/or may consist essentially of, silicone, polydimethylsiloxane, polyurethane, fluoropolymer, and/or pigment. The elastomeric covering 28, and the active surface structure 22 as a whole, may be optically transparent, absorbing, scattering, and/or pigmented. Hence, the elastomeric covering 28 and/or the active surface structure 22 may be applied to and/or may be integral with transparent structures (e.g., transparent bodies 16) and/or opaque structures (e.g., opaque bodies 16, paint, and/or exterior coatings). The elastomeric covering 28 may protect the controlled group 26 and/or the underlying structure from damage and/or environmental contamination.

Active surface structures 22 and/or bodies 16 may be layered and/or laminated structures, optionally including one or more layers 36. For example, active surface structures 22 and/or bodies 16 may include, and/or may be, a laminate composite material such as a fiber-reinforced composite. Each layer 36 of the layered and/or laminated structure may independently include carbon fiber, aramid fiber, glass fiber, resin, epoxy, and/or elastomer. When the active surface structure 22 is formed entirely of a layered and/or laminated structure, the topmost layer 36 is the elastomeric covering 28.

Different functional and non-functional elements of the active surface structures 22 and/or bodies 16 may be distributed within and/or among the layers 36. For example, the MEMS actuator(s) 30 may be arranged in a layer 36, e.g., a layer 36 of the elastomeric covering 28. Electronic components (such as MEMS actuator(s) 30) may be electrically interconnected and/or connected to electrical systems (e.g., a controller 62, as described further herein) via electrical wiring embedded in the active surface structures 22, the bodies 16, and/or the layers 36. As another example, the active surface structure 22 may be a surface layer 36 of the body 16, with the body 16 otherwise providing support for the active surface structure 22 and/or the apparatus 10.

The controlled group 26 of MEMS actuator(s) 30 is configured to selectively transition the controlled region 24 between at least the first state 42 and the second state 44 by actuation or deactuation of the MEMS actuator(s) 30. The actuation of the MEMS actuator(s) 30 distorts the exposed surface 20, causing a local change in texture (e.g., surface roughness) corresponding to the change between the first state 42 and the second state 44.

Figure 3:
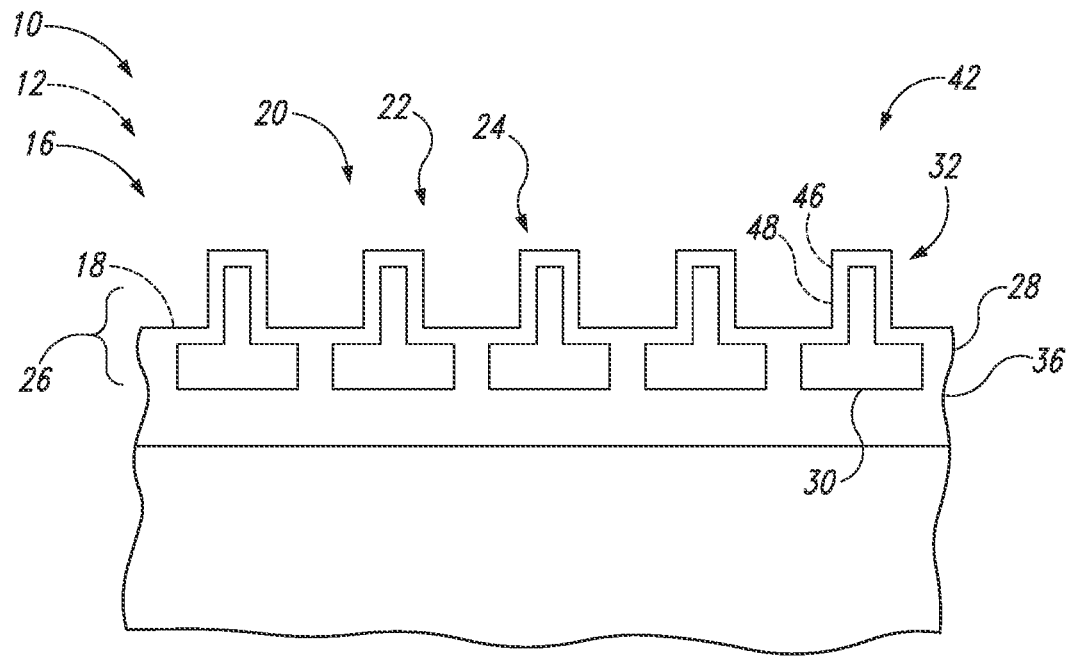
FIG. 3 is a schematic representation of an example of an active surface structure with MEMS actuators in an activated state, representing one of several geometries which may be generated.
Figure 4:
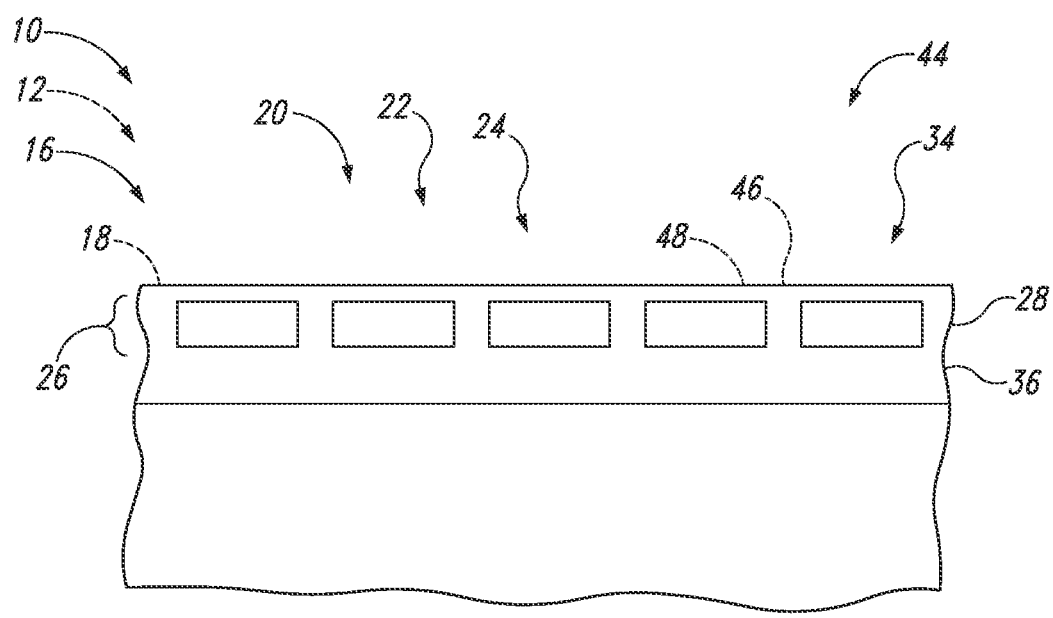
FIG. 4 is a schematic representation of an example of an active surface structure with MEMS actuators in a deactivated state.

Each MEMS actuator 30 may have an activated state 32 and a deactivated state 34 (as schematically represented in the respective examples of FIGS. 3 and 4). In the activated state 32, the MEMS actuator 30 deforms, deflects, and/or modifies a portion of the controlled region 24. In the deactivated state 34, the MEMS actuator 30 does not deform, deflect, or modify the controlled region 24 and, thus, the controlled region 24 is unaffected and/or unmodified by the MEMS actuator 30 in the deactivated state 34. Though in the examples of FIGS. 3 and 4, the activated state 32 distorts the controlled region 24 to form a more textured controlled region 24 (e.g., the first state 42) and the deactivated state 34 puts the controlled region 24 into a smoother state (e.g., the second state 44), the activated state 32 and the deactivated state 34 may have the opposite effects. That is, the unaffected and/or unmodified shape of the controlled region 24 (i.e., the shape of the exposed surface 20) may be relatively textured (hence, the MEMS actuator(s) 30 may be configured to reduce the texture upon activation) or relatively smooth (hence, the MEMS actuator(s) 30 may be configured to reduce the smoothness and increase the texture upon activation). The first state 42 of the controlled region 24 may correspond to all MEMS actuators 30 of the controlled group 26 being in the activated state 32 (as shown in FIG. 3) or all MEMS actuators 30 being in the deactivated state 34. The related second state 44 of the controlled region 24 may correspond to all MEMS actuators 30 of the controlled group 26 being in the opposite (deactivated/activated) state (i.e., all MEMS actuators 30 being in the deactivated state 34, as shown in FIG. 4, or all MEMS actuators 30 being in the activated state 32). A third state may correspond to a subset of the MEMS actuator(s) 30 of the controlled group 26 being in a particular state of actuation.

Figure 5:
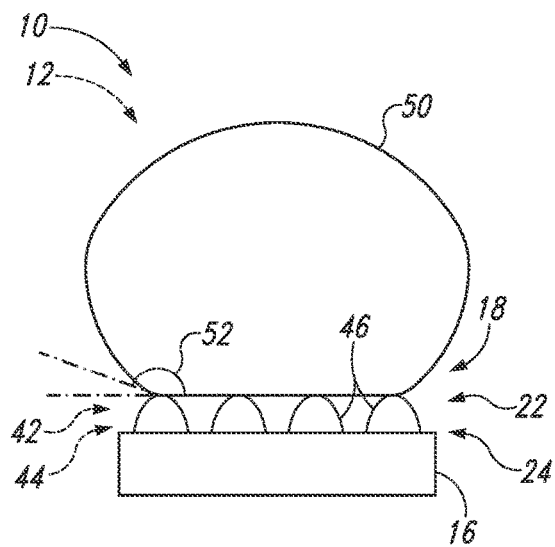
FIG. 5 is a schematic representation of an example of an active surface structure with microprotrusions holding a water drop.
Figure 6:
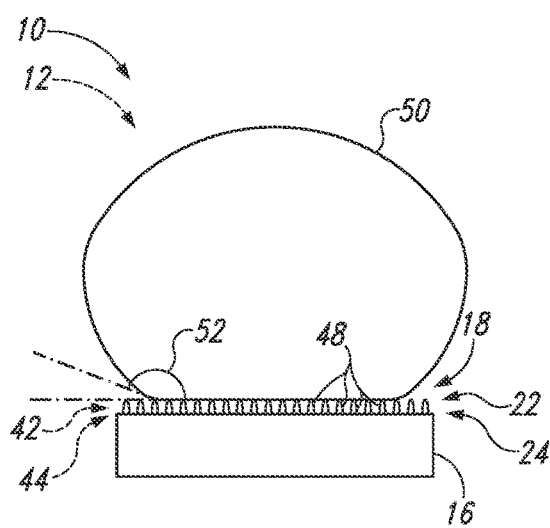
FIG. 6 is a schematic representation of an example of an active surface structure with nanoprotrusions holding a water drop.
Figure 7:
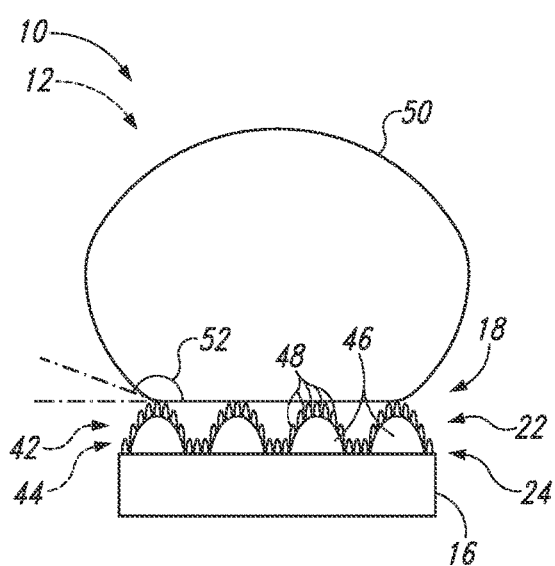
FIG. 7 is a schematic representation of an example of an active surface structure with a hierarchical combination of microprotrusions and nanoprotrusions holding a water drop.

As illustrated in the examples of FIGS. 5-7, controlled regions 24 may have a micro-textured surface (FIG. 5), a nano-textured surface (FIG. 6), and/or a hierarchically textured surface (FIG. 7). Micro-textured, nano-textured, and hierarchically textured also may be called micro-roughness, nano-roughness, and hierarchical roughness, respectively. The textured surfaces may be configured to increase the hydrophobicity of the controlled region 24 (relative to the same material and surface without the textured surface).

The controlled region 24 in the first state 42 and/or in the second state 44 may be micro-textured, nano-textured, and/or hierarchically textured. However, generally a state of greater hydrophobicity may have more texture than in a state of lesser hydrophobicity. For example, if the second state 44 lacked any small-scale texture, the first state 42 may be micro-textured, nano-textured, and/or hierarchically textured. As another example, the second state 44 may be nano-textured and the first state 42 may be micro-textured and/or hierarchically textured. As yet another example, the second state 44 may be micro-textured and the first state 42 may be nano-textured and/or hierarchically textured.

Micro-textured surfaces, as illustrated in the example of FIG. 5, include a plurality of microprotrusions 46 (micronscaled features). The MEMS actuator(s) 30 may be configured to selectively form the microprotrusions 46 and/or to selectively eliminate the microprotrusions 46. Microprotrusions 46 are configured to trap gas between a water drop 50 on the controlled region 24 and the controlled region 24. Microprotrusions 46 may include, and/or may be, columns, posts, pins, filaments, ridges, ribs, cones, pyramids, lobes, projections, and/or convexities. Additionally, microprotrusions 46 may include interconnecting webs, membranes, and/or other structures connecting two or more microprotrusions 46 together. Microprotrusions 46 may be arrayed across the controlled region 24 (in a regular, irregular, and/or random arrangement) and may be spaced apart from one another with an average spacing of less than 100 µm (microns), less than 30 µm, less than 10 µm, less than 3 µm, less than 1 µm, greater than 1 µm, greater than 3 µm, greater than 10 µm, and/or greater than 30 µm. The spaces between the microprotrusions 46 may be referred to as microcavities. Microprotrusions 46 may have an average height of less than 100 µm, less than 30 µm, less than 10 µm, less than 3 µm, less than 1 µm, greater than 1 µm, greater than 3 µm, greater than 10 µm, and/or greater than 30 µm.

Nano-textured surfaces, as illustrated in the example of FIG. 6, include a plurality of nanoprotrusions 48 (nanometer-scaled features). Nanoprotrusions 48 are smaller than microprotrusions 46 and may be much smaller than microprotrusions 46. The MEMS actuator(s) 30 may be configured to selectively form the nanoprotrusions 48 and/or to selectively eliminate the nanoprotrusions 48. Nanoprotrusions 48 are configured to trap gas between a water drop 50 on the controlled region 24 and the controlled region 24. Nanoprotrusions 48 may include, and/or may be, asperities, columns, posts, pins, filaments, ridges, ribs, clusters, particles, lobes, projections, and/or convexities. Additionally, nanoprotrusions 48 may include interconnecting webs, membranes, and/or other structures connecting two or more nanoprotrusions 48 together. Nanoprotrusions 48 may be arrayed across the controlled region 24 (in a regular, irregular, and/or random arrangement) and may be spaced apart from one another with an average spacing of less than 1,000 nm, less than 300 nm, less than 100 nm, less than 30 nm, less than 10 nm, less than 3 nm, greater than 1 nm, greater than 3 nm, greater than 10 nm, greater than 30 nm, and/or greater than 100 nm. The spaces between the nanoprotrusions 48 may be referred to as nanocavities. Nanoprotrusions 48 may have an average height of less than 1,000 nm, less than 300 nm, less than 100 nm, less than 30 nm, less than 10 nm, less than 3 nm, greater than 1 nm, greater than 3 nm, greater than 10 nm, greater than 30 nm, and/or greater than 100 nm.

Hierarchically textured surfaces, as illustrated in the example of FIG. 7, include a plurality of microprotrusions 46 and a plurality of nanoprotrusions 48 interspersed with one another. On hierarchically textured surfaces, nanoprotrusions 48 may be on top of and/or project from microprotrusions 46. The MEMS actuator(s) 30 may be configured to selectively form and/or to selectively eliminate microprotrusions 46 and/or nanoprotrusions 48. For example, the MEMS actuator(s) 30 may selectively form and/or eliminate at least one of the microprotrusions 46 and/or at least one of the nanoprotrusions 48.

Returning to FIG. 1, MEMS actuators 30 are small electro-mechanical devices that typically are formed using microfabrication and/or nanofabrication techniques. MEMS actuators 30 also may be called microsystems actuators, micromachined actuators, nano-electro-mechanical system (NEMS) actuators, nanosystems actuators, and/or nanomachined actuators. The physical dimensions of MEMS actuators 30 generally are between about one micron and several millimeters, though MEMS actuators may include larger or smaller structures, e.g., structures as small as one atom. MEMS actuators 30 include a moving element configured to change shape upon application of an electrical signal. Examples of MEMS actuators 30 include electrostatic actuators, thermal actuators, piezoelectric actuators, electromagnetic actuators, thermopneumatic actuators, thin film bulk acoustic resonators, and bent beam thermal actuators. MEMS actuators 30 typically are fabricated on and/or from semiconductor substrates and may include a piezoelectric material, a shape memory material, and/or a bimetallic material. Further descriptions of MEMS actuators suitable to be a MEMS actuator 30 may be found in Girbau, D., et al., "RF MEMS Switches Based on the Buckle-beam Thermal Actuator," 33rd European Microwave Conf. Proc. 2, pp. 651-654 (2003) and Wang. K., et al., "Micromachined Bulk Acoustical-wave RF Filters," 7th Intl. Conf. on Solid-State and Integrated Circuits Technology Proc., pp. 1687-1690 (2004). The disclosures of Girbau et al. and Wang et al. are herein incorporated by reference for all purposes.

A single MEMS actuator 30 may be configured to selectively form and/or eliminate one or more microprotrusions 46 and/or nanoprotrusions 48. The MEMS actuators 30 may be arrayed under the controlled region 24 (in a regular, irregular, and/or random arrangement) and/or arranged in a layer 36 (e.g., within the elastomeric covering 28). MEMS actuators 30 may be spaced apart from one another with an average spacing of less than 100 µm, less than 30 µm, less than 10 µm, less than 3 µm, less than 1 µm, less than 0.3 µm, less than 0.1 µm, greater than 0.1 µm, greater than 0.3 µm, greater than 1 µm, greater than 3 µm, greater than 10 µm, and/or greater than 30 µm. MEMS actuators 30 may be disposed under the controlled region 24 at a surface density of at least 100, at least 1,000, at least 10,000, at least 100,000, at least 1,000,000, at most 10,000,000, at most 1,000,000, at most 100,000, at most 10,000, and/or at most 1,000 per square centimeter.

Active surface structures 22 also may comprise a plurality of vibration generators 64 that are configured to selectively vibrate the controlled region 24 and/or to selectively impart a sonic shock into the controlled region 24. Vibration generators 64 may impart sonic energy (e.g., infrasonic, acoustic, and/or ultrasonic energy) into the controlled region 24. Additionally or alternatively, vibration generators 64 may impart a sonic shock that propagates to the controlled region 24. A sonic shock is a shock wave (e.g., induced by a large impulse of sonic energy) that emanates from the vibration generator 64. Shock waves travel faster than the speed of sound in the medium (e.g., the material(s) of the active surface structure 22, the layer(s) 36, and/or the elastomeric covering 28).

Vibration generators 64 generally are configured to shed ice, water, oil, dirt, and/or other contaminants from at least the controlled region 24 of the exposed surface 20. Vibration generators 64 may include, and/or may be, a sonic generator, a sonic transducer, an ultrasonic generator, an ultrasonic transducer, an acoustic resonator, and/or a piezoelectric actuator. Additionally or alternatively, MEMS actuators 30 may include one or more vibration generators 64. Vibration generators 64 may be arrayed under the controlled region 24 (in a regular, irregular, and/or random arrangement) and/or arranged in a layer 36 (e.g., within the elastomeric covering 28, interspersed in a layer with the MEMS actuator(s) 30, and/or in a layer below a layer of MEMS actuator(s) 30).

Active surface structures 22 may comprise one or more heaters 66 that are configured to selectively heat the controlled region 24. Heaters 66 generally are configured to melt ice that may form on the controlled region 24 and/or to raise the temperature of the controlled region 24 to and/or above the local freezing point and/or dew point. MEMS actuators 30 and/or vibration generators 64 may include heaters 66. Heaters 66 may be arrayed under the controlled region 24 (in a regular, irregular, and/or random arrangement) and/or arranged in a layer 36 (e.g., within the elastomeric covering 28, interspersed in a layer with the MEMS actuator(s) 30, interspersed in a layer with the vibration generators 64, in a layer below a layer of MEMS actuator(s) 30, and/or in a layer below or above a layer of vibration generators 64).

Apparatus 10 may comprise a controller 62 and/or one or more sensors 60. The sensors 60 are configured to measure, to detect, and/or to determine properties related to the apparatus 10, the body 16, the exposed surface 20, the active surface structure 22, the controlled region 24, the controlled group 26, one or more MEMS actuators 30, and/or the environment near (e.g., proximate to) any one or more of the foregoing. The property may include, and/or may be, temperature, speed of the apparatus 10 and/or one of its components, wind speed, wind direction, orientation of the apparatus 10 and/or one of its components (e.g., orientation of the exposed surface 20), angle of attack (angle of an object relative to the air velocity), humidity, and/or pressure. The sensor(s) 60 may be configured, collectively and/or individually, to measure, to detect, and/or to determine condensation conditions, icing conditions, environmental conditions, and/or exposed surface conditions.

Generally, the controller 62 is configured to control the active surface structure 22 based on input (e.g., information, signal(s), etc.) from the sensor(s) 60. However, the controller 62 does not necessarily require sensors 60. For example, the controller 62 may control the active surface structure 22 based upon a predetermined pattern and/or external input. Where the sensor(s) 60 are configured to measure a property affected by the state of the active surface structure 22, the controller 62 may be configured to control the active surface structure 22 in a feedback loop with the sensor(s) 60. Controllers 62 may include, and/or may be, a computer, a programmable logic controller, a power controller, and/or a power supply.

Controllers 62 may be configured to receive input from at least one sensor 60 (i.e., to receive the output of at least one sensor 60). Where the apparatus 10 includes avionics, the controller 62 may be configured to communicate with the avionics, for example, receiving input from the avionics (e.g., the avionics includes a sensor 60) and/or sending output to the avionics.

Controllers 62 are configured to transition the controlled region 24 of exposed surface 20 between at least the first state 42 and the second state 44 by transitioning the MEMS actuator(s) 30 of the controlled group 26 between the activated state 32 and the deactivated state 34 (e.g., by activating and/or deactivating the MEMS actuator(s) 30). Controllers 62 may be configured to transition the controlled region 24 from the second state 44 to the first state 42 based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions. Further, controllers 62 may control optional vibration generators 64 and/or optional heaters 66. For example, the controller 62 may be configured to activate the vibration generator 64 and/or the heater 66 based upon a detection of condensation conditions, a detection of icing conditions, a detection of environmental conditions, a detection of exposed surface conditions, a forecast of condensation conditions, a forecast of icing conditions, a forecast of environmental conditions, and/or a forecast of exposed surface conditions.

Active surface structures 22 may be utilized to minimize water accumulation, to prevent water accumulation, to remove water accumulation, to remove ice accumulation, to prevent ice accumulation, to remove contamination, and/or to prevent contamination on the exposed surface 20. Methods of use may comprise activating the controlled region 24 by transitioning the controlled region 24 to the first state 42 from the ordinary state 44, and deactivating the controlled region 24 by transitioning the controlled region 24 to the second state 44 from the first state 42. Where the apparatus 10 includes a sensor 60, the activating may include activating the controlled region 24 based upon a sensor output and/or the deactivating may include deactivating the controlled region 24 based upon a sensor output. The activating and/or the deactivating may include activating and/or deactivating, respectively, based upon a property of the apparatus 10, the body 16, the exposed surface 20, the active surface structure 22, the controlled region 24, the controlled group 26, one or more MEMS actuators 30, and/or the environment near (e.g., proximate to) any one or more of the foregoing.

Methods may further comprise determining the presence of a condensation condition, an icing condition, an environmental condition, an exposed surface condition, a forecasted condensation condition, a forecasted icing condition, a forecasted environmental condition, and/or a forecasted exposed surface condition, and then transitioning the controlled region 24 to the first state 42. Controllers 62 may be configured and/or programmed to perform any of the foregoing methods.

Examples of inventive subject matter according to the present disclosure are described in the following enumerated paragraphs.

A1. An active surface structure comprising:
an exposed surface;
a controlled group of one or more micro-electro-mechanical system (MEMS) actuators; and
a controlled region of the exposed surface corresponding to the controlled group;
wherein the controlled region is configured to be actively changed between a first state and a second state as a result of the one or more MEMS actuators being activated or deactivated, wherein the exposed surface in the first state is more textured than in the second state, and wherein the controlled region in at least one of the first state and the second state includes a plurality of nanoprotrusions projecting from a plurality of microprotrusions as a result of the one or more MEMS actuators being activated or deactivated, wherein the nanoprotrusions are spaced apart from one another with an average spacing of 1-1,000 nanometers (nm) and have an average height of 1-1,000 nm, and wherein the microprotrusions are spaced apart from one another with an average spacing of 1-100 microns (μm) and have an average height of 1-100 μm.

A2. The active surface structure of paragraph A1, wherein the second state is less hydrophobic than the first state.

A3. The active surface structure of any of paragraphs A1-A2, wherein the first state is a hydrophobic state or a superhydrophobic state, and wherein the second state is a hydrophilic state or a superhydrophilic state.

A4. The active surface structure of any of paragraphs A1-A3, wherein a contact angle of water with the controlled region in the second state is less than 60°.

A5. The active surface structure of any of paragraphs A1-A4, wherein the second state is an oleophobic state.

A6. The active surface structure of any of paragraphs A1-A5, wherein the second state is an oleophilic state.

A7. The active surface structure of any of paragraphs A1-A6, wherein the one or more MEMS actuators comprises one or more nano-electro-mechanical system (NEMS) actuators.

A8. The active surface structure of any of paragraphs A1-A7, wherein, in the first state, each MEMS actuator of the controlled group is activated to deform a portion of the controlled region and wherein, in the second state of the controlled region, each MEMS actuator of the controlled group is deactivated, and the controlled region is unaffected by the controlled group of the one or more MEMS actuators.

A9. The active surface structure of any of paragraphs A1-A8, wherein the controlled region in the first state includes the plurality of microprotrusions, and wherein the one or more MEMS actuators are configured to selectively form the microprotrusions.

A10. The active surface structure of any of paragraphs A1-A9, wherein the one or more MEMS actuators are configured to selectively form the nanoprotrusions.

A11. The active surface structure of any of paragraphs A1-A10, further comprising a plurality of vibration generators configured to selectively impart a sonic shock into the controlled region.

A12. The active surface structure of paragraph A11, wherein the plurality of vibration generators are interspersed with the one or more MEMS actuators.

A13. The active surface structure of any of paragraphs A1-A12, further comprising an outer elastomeric covering, wherein the outer elastomeric covering defines the exposed surface, and wherein the controlled group of one or more MEMS actuators is embedded within or covered by the outer elastomeric covering.

A14. The active surface structure of paragraph A13, wherein the outer elastomeric covering is hydrophilic, and further wherein an activation of the controlled group of the one or more M EMS actuators causes the controlled region to transition between the first state and the second state.

A15. The active surface structure of any of paragraphs A13-A14, wherein the active surface structure is a laminated structure comprising:
the outer elastomeric covering; and
an electrical wiring layer electrically connected to the one or more MEMS actuators and positioned below the outer elastomeric covering.

A16. The active surface structure of paragraph A15, further comprising a/the plurality of vibration generators, wherein the laminated structure further comprises a sublayer opposite the exposed surface relative to the outer elastomeric covering, and wherein the plurality of vibration generators are arranged within the sublayer of the laminated structure.

A17. The active surface structure of any of paragraphs A1-A16, wherein the controlled region is in one of the first state and the second state according to an activation state of the controlled group of the one or more MEMS actuators.

A18. The active surface structure of any of paragraphs A1-A17, wherein each MEMS actuator of the controlled group has an activated state in which each MEMS actuator deforms a portion of the controlled region and has a deactivated state in which the controlled region is unaffected by the one or more MEMS actuators, wherein the second state of the controlled region corresponds to all the MEMS actuators of the controlled group being in the deactivated state, and wherein the first state of the controlled region corresponds to all the MEMS actuators of the controlled group being in the activated state.

A19. An apparatus comprising:
a body; and
the active surface structure of any of paragraphs A1-A18;
wherein the body includes the active surface structure.

A20. The apparatus of paragraph A19, wherein the body includes an aerodynamic component that has a leading edge, and wherein the active surface structure is proximate to the leading edge.

A21. The apparatus of any of paragraphs A19-A20, further comprising one or more sensors configured to detect at least one of an environmental condition and an exposed surface condition, and further comprising a controller configured to control the controlled region based at least on information from the one or more sensors in a feedback loop.

A22. The apparatus of any of paragraphs A19-A21, further comprising a/the controller configured to transition the controlled region between the first state and the second state by activating the one or more MEMS actuators of the controlled group to transition to the first state, and by deactivating the one or more MEMS actuators of the controlled group to transition to the second state.

A23. The apparatus of any of paragraphs A19-A22, further comprising a/the controller and one or more sensors, wherein the controller is configured to transition the controlled region from the second state to the first state based upon a detection of condensation conditions, a detection of icing conditions, a forecast of condensation conditions, and/or a forecast of icing conditions.

A24. The apparatus of any of paragraphs A19-A23, wherein the controlled region is in one of the first state and the second state according to an/the activation state of the controlled group of the one or more MEMS actuators.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function. Further, as used herein, the singular forms "a", "an" and "the" may be intended to include the plural forms as well, unless the context clearly indicates otherwise.

The various disclosed elements of apparatuses and steps of methods disclosed herein are not required of all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

In the event that any patents or patent applications are incorporated by reference herein and (1) define a term in a manner and/or (2) are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

The invention claimed is:

1. An active surface structure comprising:
   an exposed surface;
   a controlled group of one or more micro-electro-mechanical system (MEMS) actuators; and
   a controlled region of the exposed surface corresponding to the controlled group;
   wherein the controlled region is configured to be actively changed between a first state and a second state as a result of the one or more MEMS actuators being activated or deactivated, wherein the exposed surface in the first state is more textured than in the second state, and wherein the controlled region in at least one of the first state and the second state includes a plurality of nanoprotrusions projecting from a plurality of microprotrusions as a result of the one or more MEMS actuators being activated or deactivated, wherein the nanoprotrusions are spaced apart from one another with an average spacing of 1-1,000 nanometers (nm) and have an average height of 1-1,000 nm, and wherein the microprotrusions are spaced apart from one another with an average spacing of 1-100 microns (µm) and have an average height of 1-100 µm.

2. The active surface structure of claim 1, wherein the second state is less hydrophobic than the first state.

3. The active surface structure of claim 1, wherein the first state is a hydrophobic state or a superhydrophobic state, and wherein the second state is a hydrophilic state or a superhydrophilic state.

4. The active surface structure of claim 1, wherein a contact angle of water with the controlled region in the second state is less than 60°.

5. The active surface structure of claim 1, wherein the second state is an oleophobic state.

6. The active surface structure of claim 1, wherein the second state is an oleophilic state.

7. The active surface structure of claim 1, wherein the one or more MEMS actuators comprises one or more nano-electro-mechanical system (NEMS) actuators.

8. The active surface structure of claim 1, wherein, in the first state, each MEMS actuator of the controlled group is activated to deform a portion of the controlled region and wherein, in the second state of the controlled region, each MEMS actuator of the controlled group is deactivated, and the controlled region is unaffected by the controlled group of the one or more MEMS actuators.

9. The active surface structure of claim 1, wherein the controlled region in the first state includes the plurality of microprotrusions, and wherein the one or more MEMS actuators are configured to selectively form the microprotrusions.

10. The active surface structure of claim 1, wherein the one or more MEMS actuators are configured to selectively form the nanoprotrusions.

11. The active surface structure of claim 1, further comprising a plurality of vibration generators configured to selectively impart a sonic shock into the controlled region.

12. The active surface structure of claim 11, wherein the plurality of vibration generators are interspersed with the one or more MEMS actuators.

13. The active surface structure of claim 1, further comprising an outer elastomeric covering, wherein the outer elastomeric covering defines the exposed surface, and wherein the controlled group of one or more MEMS actuators is embedded within or covered by the outer elastomeric covering.

14. The active surface structure of claim 13, wherein the outer elastomeric covering is hydrophilic, and further wherein an activation of the controlled group of the one or more MEMS actuators causes the controlled region to transition between the first state and the second state.

15. The active surface structure of claim 13, wherein the active surface structure is a laminated structure comprising:
   the outer elastomeric covering; and
   an electrical wiring layer electrically connected to the one or more MEMS actuators and positioned below the outer elastomeric covering.

16. The active surface structure of claim 15, further comprising a plurality of vibration generators, wherein the laminated structure further comprises a sublayer opposite the exposed surface relative to the outer elastomeric covering, and wherein the plurality of vibration generators are arranged within the sublayer of the laminated structure.

17. The active surface structure of claim 1, wherein the controlled region is in one of the first state and the second state according to an activation state of the controlled group of the one or more MEMS actuators.

18. The active surface structure of claim 1, wherein each MEMS actuator of the controlled group has an activated state in which each MEMS actuator deforms a portion of the controlled region and has a deactivated state in which the controlled region is unaffected by the one or more MEMS actuators, wherein the second state of the controlled region corresponds to all the MEMS actuators of the controlled group being in the deactivated state, and wherein the first state of the controlled region corresponds to all the MEMS actuators of the controlled group being in the activated state.

19. An apparatus comprising:
a body; and
the active surface structure of claim 1;
wherein the body includes the active surface structure.

20. The apparatus of claim 19, wherein the body includes an aerodynamic component that has a leading edge, and wherein the active surface structure is proximate to the leading edge.

21. The apparatus of claim 19, further comprising one or more sensors configured to detect at least one of an environmental condition and an exposed surface condition, and further comprising a controller configured to control the controlled region based at least on information from the one or more sensors in a feedback loop.

22. The apparatus of claim 19, further comprising a controller configured to transition the controlled region between the first state and the second state by activating the one or more MEMS actuators of the controlled group to transition to the first state, and by deactivating the one or more MEMS actuators of the controlled group to transition to the second state.

23. The apparatus of claim 19, further comprising a controller and one or more sensors, wherein the controller is configured to transition the controlled region from the second state to the first state based upon a detection of condensation conditions, a detection of icing conditions, a forecast of condensation conditions, and/or a forecast of icing conditions.

24. The apparatus of claim 19, wherein the controlled region is in one of the first state and the second state according to an activation state of the controlled group of the one or more MEMS actuators.

* * * * *